United States Patent [19]
Sauer

[11] Patent Number: 6,121,848
[45] Date of Patent: Sep. 19, 2000

[54] INTEGRATED ACCURATE THERMAL FREQUENCY REFERENCE

[75] Inventor: Don Sauer, San Jose, Calif.

[73] Assignee: National Semiconductor Corporation, Santa Clara, Calif.

[21] Appl. No.: 09/231,456

[22] Filed: Jan. 14, 1999

[51] Int. Cl.[7] ........................................... H03B 5/12
[52] U.S. Cl. .................... 331/108 C; 331/175; 331/176; 324/711
[58] Field of Search ........................... 331/108 C, 108 D, 331/108 R, 66, 70, 175, 176; 327/262, 371; 324/711

[56] References Cited

U.S. PATENT DOCUMENTS

| | | | |
|---|---|---|---|
| 3,766,444 | 10/1973 | Bosch | 317/234 R |
| 4,058,779 | 11/1977 | Fraley | 331/108 R |
| 4,757,528 | 7/1988 | Falater et al. | 379/412 |
| 5,041,800 | 8/1991 | Long et al. | 331/69 |
| 5,697,082 | 12/1997 | Greer et al. | 455/255 |

OTHER PUBLICATIONS

Shanks, et al., Thermal Conductivity Of Silicon From 300 To 1400 ° K*, Physical Review, vol. 130, No. 5, Jun. 1, 1963, pp. 1743–1748.

Louw, et al., Inductor–Less, Capacitor–Less State–Variable Electrothermal Filters, IEEE Journal of Solid–State Circu, May 1975, pp. 416–424.

Heasell, E.L., The Heat–Flow Problem In Silicon: An Approach To An Analytical Solution With Application To The Calculation Of Thermal Instability In Bipolar Devices, IEEE Transaction On Electron Devices, vol. ED–25, No. 12, Dec. 1978, pp. 1382–1388.

*Primary Examiner*—Robert Pascal
*Assistant Examiner*—Kimberly Glenn
*Attorney, Agent, or Firm*—Limbach & Limbach L.L.P.

[57] ABSTRACT

A thermal RC network is fabricated in silicon as a lateral array of forward-biased PN junctions, which may take the form of the base-emitter junctions of bipolar transistors. Application of a clock signal from a voltage controlled oscillator to the silicon produces a heat pulse which propagates across the arrayed transistors of the thermal RC network. The resulting change in temperature produces a change in the $V_{be}$ of the arrayed transistors. The phase shift between the original clock signal and the changed $V_{be}$ is determined solely by the time constant $\tau$ of the particular thermal RC network. This time constant is a function only of the intrinsic thermal resistance and thermal capacitance of the silicon and the spacing of the laterally-arrayed transistors. The time constant is independent of the amplitude, frequency, and duty cycle of the original clock signal. The original clock signal and the time-delayed output of the RC network can be compared, and the phase shift determined. A voltage corresponding to this phase shift is then generated and fed back into the voltage controlled oscillator, producing an output signal having a constant frequency.

24 Claims, 8 Drawing Sheets

FIG. 1

Temperature Dependence
of Specific Heat in Silicon

INTEGRATED ACCURATE THERMAL FREQUENCY REFERENCE

BACKGROUND OF THE INVENTION

1. Field of the Invention

The present invention relates to a frequency reference for an oscillation circuit, and in particular, to a frequency reference formed from standard components internal to an integrated circuit that utilizes the thermal time constant of silicon to maintain constant frequency oscillation.

2. Description of the Related Art

Oscillators are well known in the art of solid state electronics. Oscillator circuits producing a constant frequency signal are extremely useful for performing vital system functions such as clocking. Any constant frequency oscillator requires: 1) a source of power; 2) an amplifying device; and 3) some form of resonant circuit to maintain the frequency of output.

Solid-state, constant-frequency oscillator circuits formed from semiconductors must include a frequency reference. This frequency reference enables the oscillator to maintain a constant frequency output. In many solid-state circuits, the source of this frequency reference is a separate crystal having an intrinsic vibrational frequency. Such a circuit utilizes the crystal's inherent vibration to generate a constant frequency output signal.

Unfortunately, incorporating an external component such as a crystal into an IC creates additional complexity and expense in the manufacturing process. Therefore, there is a need in the art for a structure formed from standard integrated circuit components that is capable of maintaining the output of an oscillator at a regular frequency.

SUMMARY OF THE INVENTION

The present invention relates to a frequency reference for an oscillation circuit that takes advantage of the thermal resistance and capacitance of single crystal silicon to maintain a constant frequency output. A thermal RC network can be fabricated in the silicon in the form of a lateral array of bipolar transistors. Application of a clock signal from a voltage-controlled oscillator to the silicon produces a heat pulse which propagates through the silicon and across this thermal network.

Because the base-emitter voltage ($V_{be}$) of the bipolar transistors is highly temperature dependent, propagation of the heat pulse through the silicon causes a fluctuation in $V_{be}$ of the arrayed transistors. Comparison of the $V_{be}$ appearing across two transistors in the array results in a combined voltage signal whose magnitude is determined by the distance between the transistors and the time constant $\tau$ of the thermal RC network. This time constant $\tau$ is solely a function of the mass of single crystal silicon present between the laterally-arrayed PNP bipolar transistors. It is independent of the amplitude, frequency, and duty cycle of the original clock signal.

In accordance with the present invention, the original clock signal and the time-delayed voltage signal of the thermal RC network are compared, and the phase shift between these signals is determined. A voltage corresponding to this phase difference is then generated and fed back into the voltage-controlled oscillator, ensuring generation of an output signal having a constant frequency.

An apparatus for producing an output signal with a substantially constant frequency in accordance with one embodiment of the present invention comprises a semiconductor workpiece exhibiting a thermal resistance and a thermal capacitance, a voltage controlled oscillator formed in the semiconductor workpiece, the voltage controlled oscillator producing a clock signal having a first frequency, a heat source positioned at a first point within the semiconductor workpiece, the heat source receiving the clock signal and generating a heat pulse in response, a thermal RC network formed within the silicon and having a thermal time constant, the thermal RC network receiving the heat pulse and producing a voltage signal based upon the thermal time constant, a limiting amplifier receiving the voltage signal and in response producing a clipped output voltage, and a comparator receiving the clock signal and the clipped output voltage, the comparator producing a feedback voltage to the voltage controlled oscillator corresponding to a phase difference between the clock signal and the clipped output voltage, wherein the voltage controlled oscillator alters the first frequency of the clock signal in response to the feedback voltage.

A method for maintaining constant frequency output of a voltage controlled oscillator in accordance with one embodiment of the present invention comprises the steps of providing a semiconductor workpiece having a thermal resistance and a thermal capacitance, applying a clock signal from the voltage controlled oscillator to a heat source positioned at a first point within the semiconductor workpiece, the heat source generating a heat pulse in response to the clock signal, providing a thermal RC network within the silicon having a thermal time constant, the thermal RC network receiving the heat pulse and producing a voltage signal based upon the thermal time constant, amplifying and limiting the voltage signal and producing a clipped voltage output, comparing the clock signal and the clipped output voltage to produce a feedback voltage corresponding to a phase difference between the clock signal and the clipped output voltage, and providing the feedback voltage to the voltage controlled oscillator, such that the frequency of the clock signal is altered in response to the feedback voltage.

The features and advantages of the present invention will be understood upon consideration of the following detailed description of the invention and the accompanying drawings.

DETAILED DESCRIPTION

The propagation of heat through silicon can be modeled as though the silicon were composed of a series of concentric shells having the same thicknesses and increasing volumes. The heat will distribute uniformly across each shell and decrease with distance from the point of application of the thermal energy.

Figure 1:
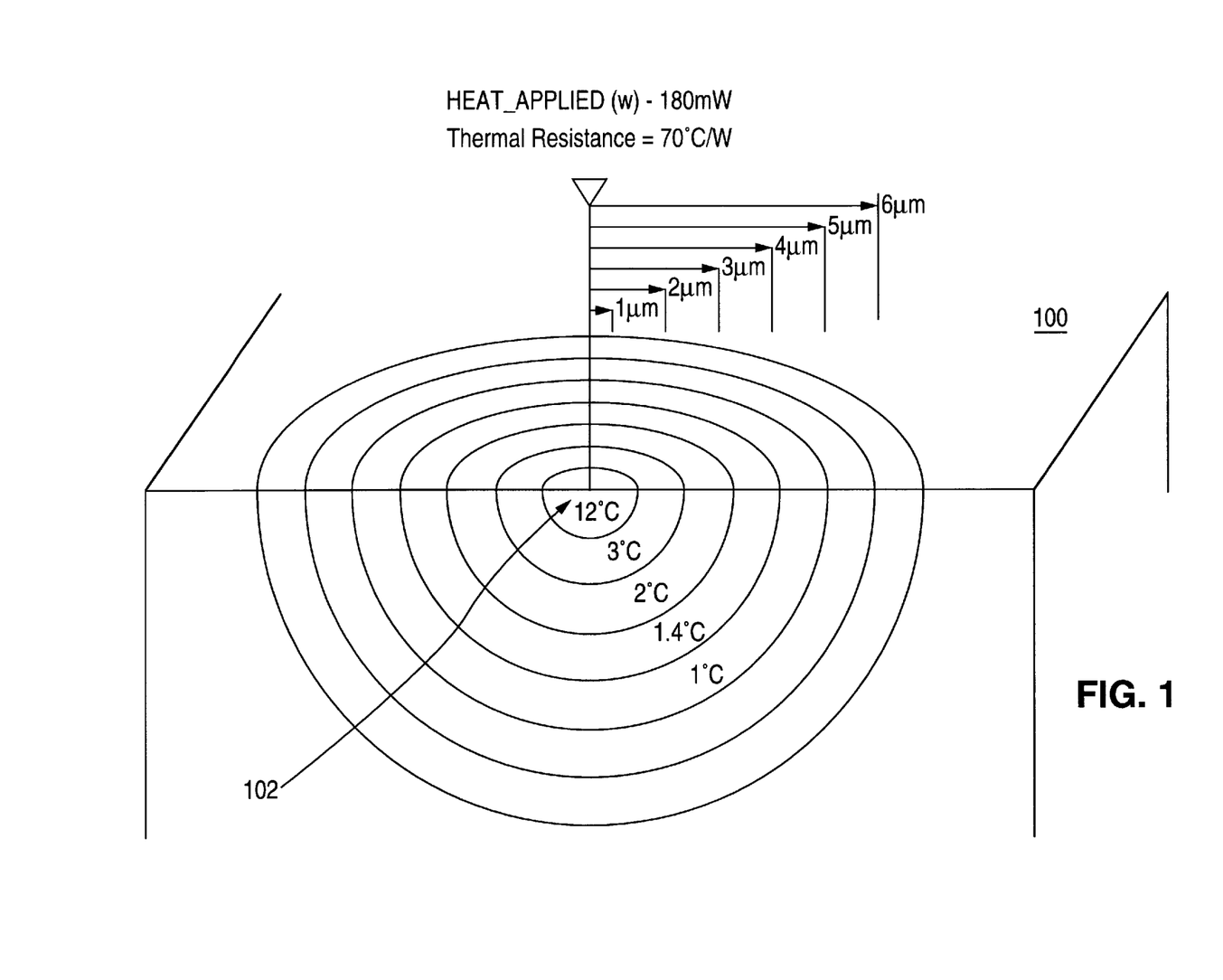
FIG. 1 shows a concentric shell model illustrating the propagation of thermal energy through silicon.

FIG. 1 shows a concentric shell model illustrating the propagation of thermal energy through a semiconductor workpiece such as silicon block 100. As is depicted in FIG. 1, the application of a "HEAT_APPLIED" electrical pulse of 180 mW at point 102 of silicon block 100 causes the propagation of a heat signal through the silicon.

Specifically, the temperature in the silicon rises 12° C. at the point of application of the electrical pulse. At a distance of 2 $\mu$m from point 102, the temperature of the silicon rises 3° C. At a distance of 2 $\mu$m from point 102, the temperature of the silicon rose 2° C. At distances of 3 $\mu$m and 4 $\mu$m from point 102, the temperature of the silicon rose 1.4° C. and 1° C., respectively.

This propagation of thermal energy through the silicon can be modeled as though it were an electrical voltage signal passing through an RC network. The silicon shells 102 in FIG. 1 can each be viewed as exhibiting a thermal resistance and a thermal capacitance.

TABLE 1 reveals the correlation between these thermal properties and their more familiar electrical equivalents:

TABLE 1

| PROPERTY | ELECTRICAL UNITS | THERMAL UNITS |
| --- | --- | --- |
| Potential | Volts | ° C. |
| Current | Amps | Watts |
| Resistance | Volts/Amps = Ohms | ° C./Watt |
| Capacitance | Volts/Q = Farad | ° C./Joule |

The thermal resistance ($C_{th\_si}$) of silicon varies over temperature, and is governed by Equation (I) below:

$$R_{th\_Si} = \frac{350}{(T-68)} \left( \frac{W}{cm \cdot K} \right) \quad (I)$$

The thermal capacitance of silicon ($C_{th\_si}$) is closely related to its specific heat. In theory, the thermal capacitance ($C_{th}$) of most solids is governed by Equation (II) below:

$$C_{th} = 3 \cdot R \approx 25.031 \frac{J}{M \cdot K} = 1.126 \frac{J}{g \cdot K} \quad (II)$$

The value shown in Equation (II) is the result of an approximation utilizing the Dulong Petit Law. The value of thermal capacitance for most minerals is about 1.3 J/(g·K).

Empirically, no consistent value for $C_{th\_Si}$ has emerged from reviewing the literature. One approximation is given by:

$$C_{th\_Si} \approx 20 \frac{J}{Mol \cdot K} = .76 \frac{J}{g \cdot K}$$

Figure 2:
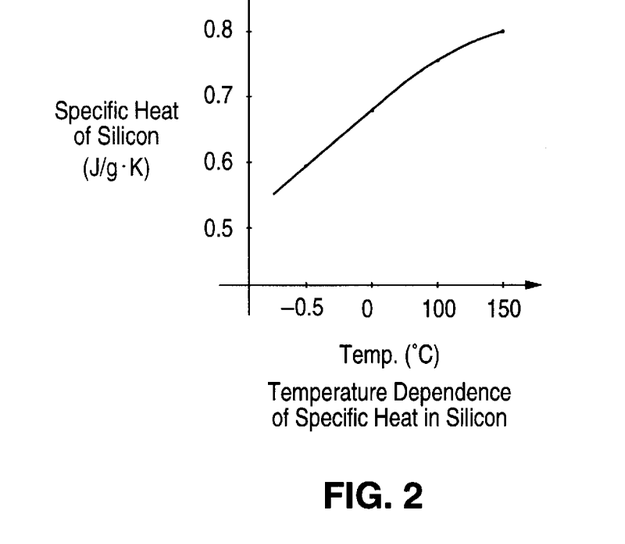
FIG. 2 plots the specific heat of silicon versus temperature.

FIG. 2 plots the specific heat of silicon over a temperature range. The data in FIG. 2 is taken from "Inductor-less, Capacitor-less State-Variable Electrothermal Filters", by Wynand J. Luow et al., IEEE Journal of Solid State Circuits, Vol. SC-12, No. 4, August 1977.

Because propagation of thermal energy through silicon may be modeled as though it were a voltage applied to an RC network, a temperature change in silicon at a given distance from the point of application of a heat pulse will vary according to a time delay $\tau$ from the time of application of the initial heat pulse. This thermal time constant $\tau$ is a function of only the spacing of the points of temperature measurement. It is independent of the amplitude, frequency, and duty cycle of the electrical signal originally giving rise to the heat pulse. Because of this consistency in the value of $\tau$, it can be utilized to generate an output signal having a constant frequency.

To understand this, recall first that an RC network may be pictured as a number of resistors and capacitors connected in series. However, an RC network may also take the form of series of bipolar transistors.

Figure 3:
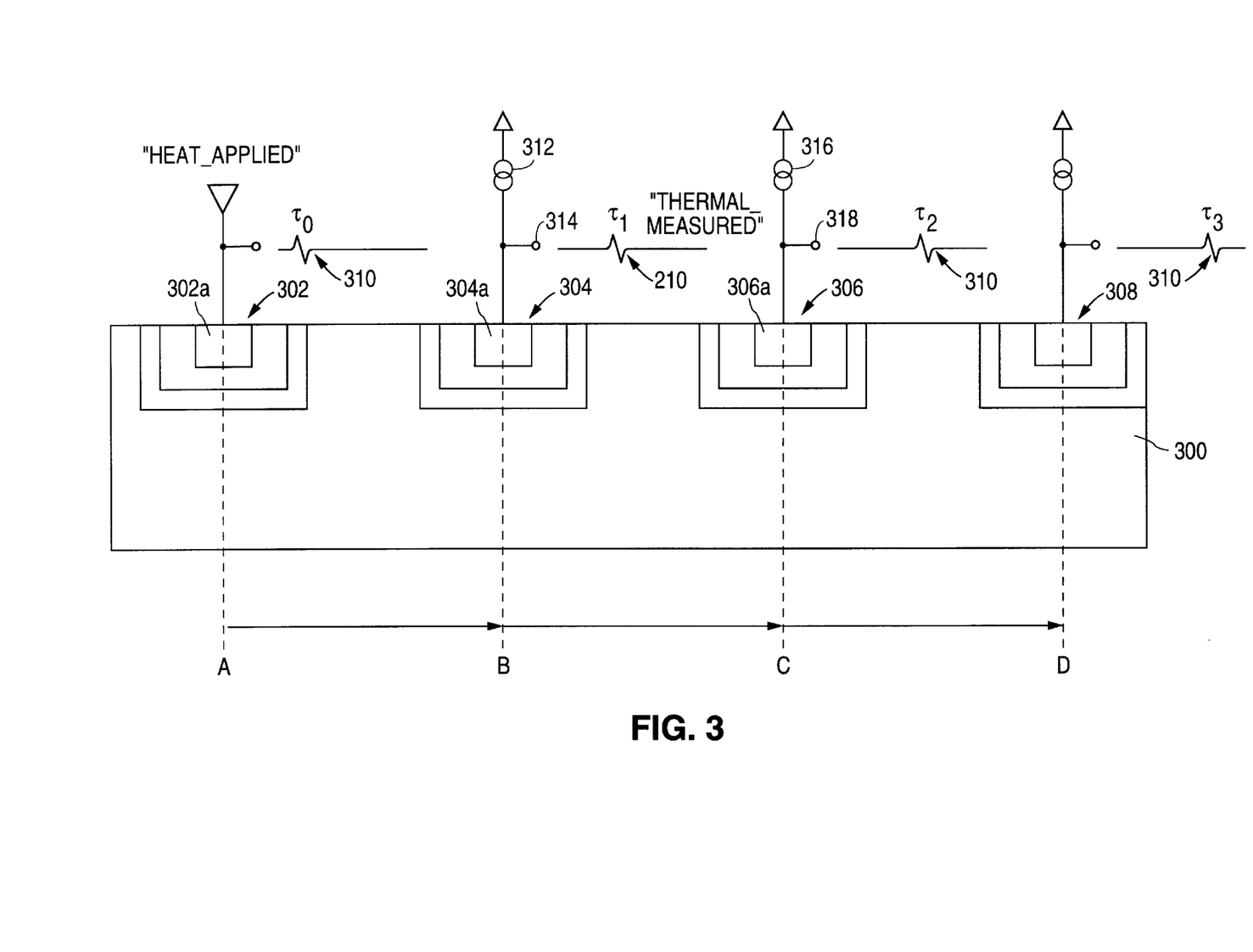
FIG. 3 illustrates a cross-sectional view of a thermal RC network in the form of a series of four laterally-arrayed PNP bipolar transistors formed within silicon.

FIG. 3 illustrates a cross-sectional view of a series of four laterally-arrayed PNP bipolar transistors 302, 304, 306, and 308 formed within silicon block 300. Bipolar transistors 302, 304, 306, and 308 are electrically isolated from each other. When a HEAT_APPLIED electrical signal is applied to emitter 302a of first PNP transistor 302, a heat pulse 310 is generated at point A in silicon block 300.

Heat pulse 310 then propagates through silicon block 300. Second bipolar transistor 304 is formed having an emitter 304a located at point B. Emitter 304a is in electrical contact with a constant current source 312. When heat pulse 310 reaches emitter 304a of second bipolar transistor 304, the conductance of transistor 304 will change. This conductivity change will be reflected in a change in $V_{be}$ of transistor 304. This change in $V_{be}$ can be detected at node 314 as a THERMAL_MEASURED voltage signal.

Because of the thermal resistance and capacitance of silicon between A and B, emitter 304a of second bipolar transistor 2–4 will experience heat pulse 310 and the THERMAL_MEASURED voltage signal delayed by a first time constant $\tau_1$. This time constant $\tau_1$ is independent of the characteristics of the initial HEAT_APPLIED voltage signal applied to emitter 302a of first PNP transistor 302.

Third bipolar transistor 306 is formed within silicon 300, such that its emitter 306a is located at point C. Emitter 306a is in electrical contact with a constant current source 316.

When the heat pulse 310 reaches emitter 306a of third bipolar transistor 306, the conductivity of transistor 306 will change. This change in conductivity will be reflected in a change in the $V_{be}$ of transistor 306. This change in $V_{be}$ can be detected at node 318.

Because of the thermal resistive and capacitive properties of the silicon present between points A and C, emitter 306a of second bipolar transistor 306 will experience the heat pulse and the resulting change in $V_{be}$ delayed by a second time constant $\tau_2$. This time constant is independent of the nature of the initial HEAT_APPLIED voltage signal applied to emitter 302a of the first PNP transistor 302. Moreover, because the distance AC is greater than the distance AB, $\tau_2 > \tau_1$.

The above description of the second and third bipolar transistors is the same for fourth transistor 308.

It is therefore possible to utilize this lateral arrangement of bipolar transistors to generate an output signal having a constant frequency output. This is accomplished by first detecting the phase difference between the time-delayed RC waveforms at the emitters of the bipolar transistors and then modulating the output of a circuit in response to this phase difference.

Figure 4A:
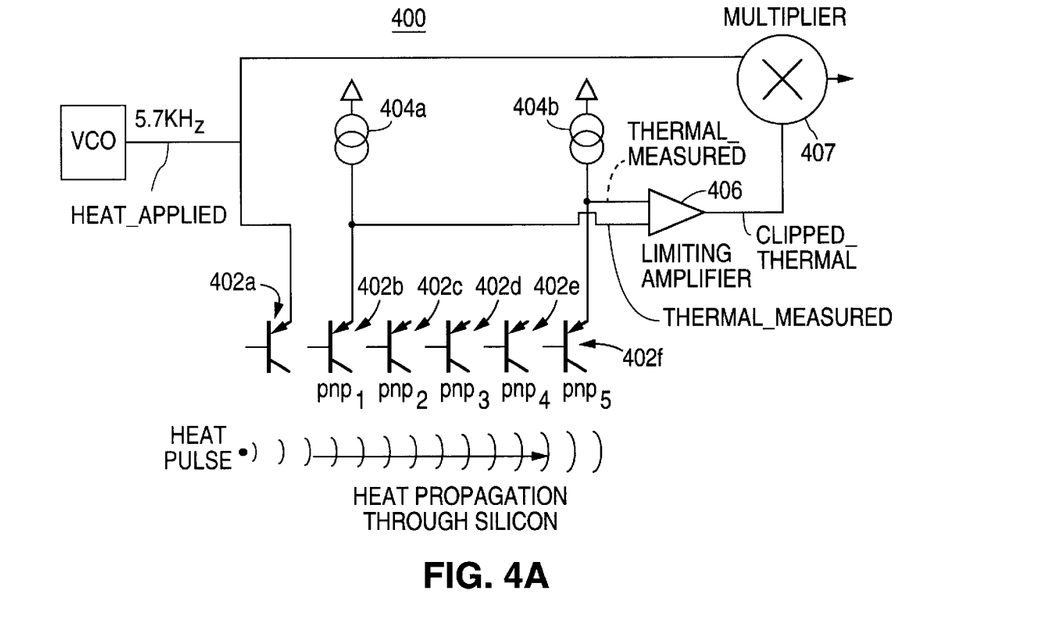
FIG. 4A shows a schematic of a detection circuit in accordance with the present invention utilizing six laterally arrayed PNP transistors connected to an FM detector.

FIG. 4A shows a schematic of a first embodiment of a detection circuit 400 in accordance with the present invention, which utilizes a lateral array of five PNP transistors 402a–402f. The emitters of arrayed transistors 402b and 402f are connected to constant current sources 404a and 404b. The emitters of transistors 402b and 402f are also connected to a limiting amplifier 406.

The THERMAL_MEASURED $V_{be}$ of transistors 402b and 402f are transmitted to limiting amplifier 406. Limiting amplifier 406 receives, amplifies, and limits these THERMAL_MEASURED signals and produces a CLIPPED_THERMAL signal reflecting the difference between them.

The purpose of comparing the THERMAL_MEASURED voltages of two separate transistors of the array is to eliminate the effect of ambient temperature changes upon the circuit. If the phase difference between the clocking signal and the thermal signal were determined utilizing the THERMAL_MEASURED signal of only one transistor, the circuit would reflect changes in the $V_{be}$ of that transistor attributable to a rise or fall in ambient temperature. By generating the composite CLIPPED_THERMAL voltage from THERMAL_MEASURED voltages of transistors experiencing the same ambient temperature, only voltage changes attributable to the heat pulse will be registered by the circuit.

The CLIPPED_THERMAL output of limiting amplifier 406 is then fed to analog multiplier 407. Multiplier 407 also receives the original clock signal, and frequency modulation detection techniques are used to determine the phase shift of the original clock (HEAT_APPLIED) signal relative to the changed $V_{be}$ (CLIPPED_THERMAL) waveform of the thermal RC network. As discussed above in connection with FIG. 4A, because this phase shift is dependent upon $\tau$, it is wholly independent of the amplitude and duty cycle of the applied clock signal.

Figure 4B:
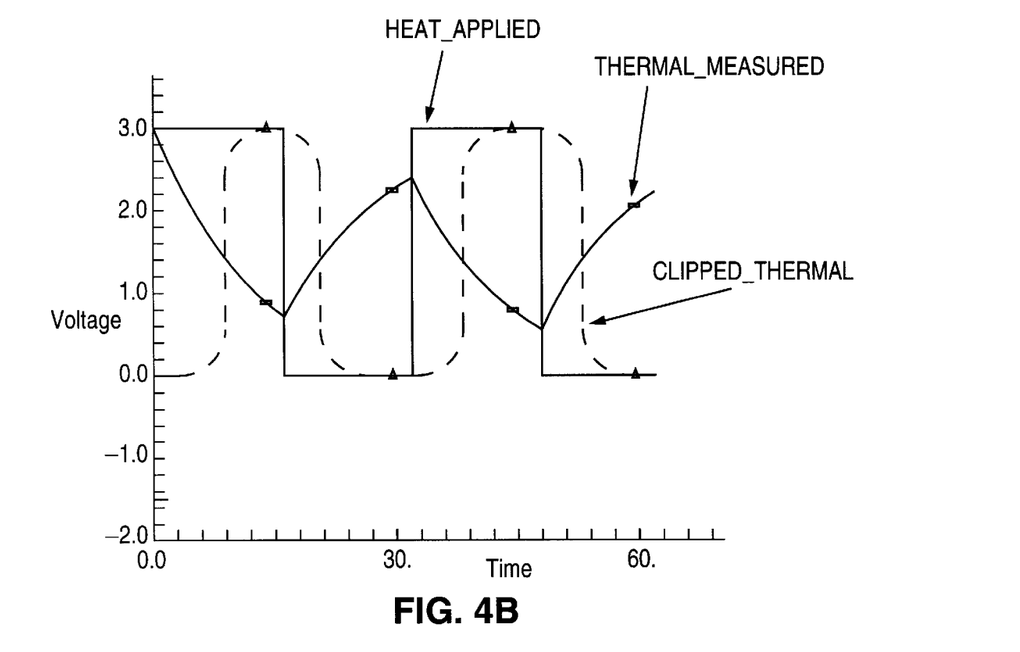
FIG. 4B plots waveforms for the HEAT_APPLIED voltage, the THERMAL_MEASURED voltage, and the CLIPPED_THERMAL voltage for the detection circuit shown in FIG. 4A.

FIG. 4B plots waveforms for the HEAT_APPLIED voltage (the clock signal), the THERMAL_MEASURED voltage, and the CLIPPED_THERMAL voltage for circuit 400. FIG. 4B reveals that when the HEAT_APPLIED voltage is applied, heat is pulsed through the silicon and transistors located at a given distance from the point of application of thermal energy experience a change in $V_{be}$. This changed $V_{be}$ (the THERMAL_MEASURED voltage) will exhibit a typical RC waveform. The time constant $\tau$ of this RC waveform is solely a function of the thermal properties of the silicon crystal and the spacing of the transistors within the silicon. It is independent of the amplitude, frequency, and duty cycle of the original HEAT_APPLIED signal.

Figure 4C:
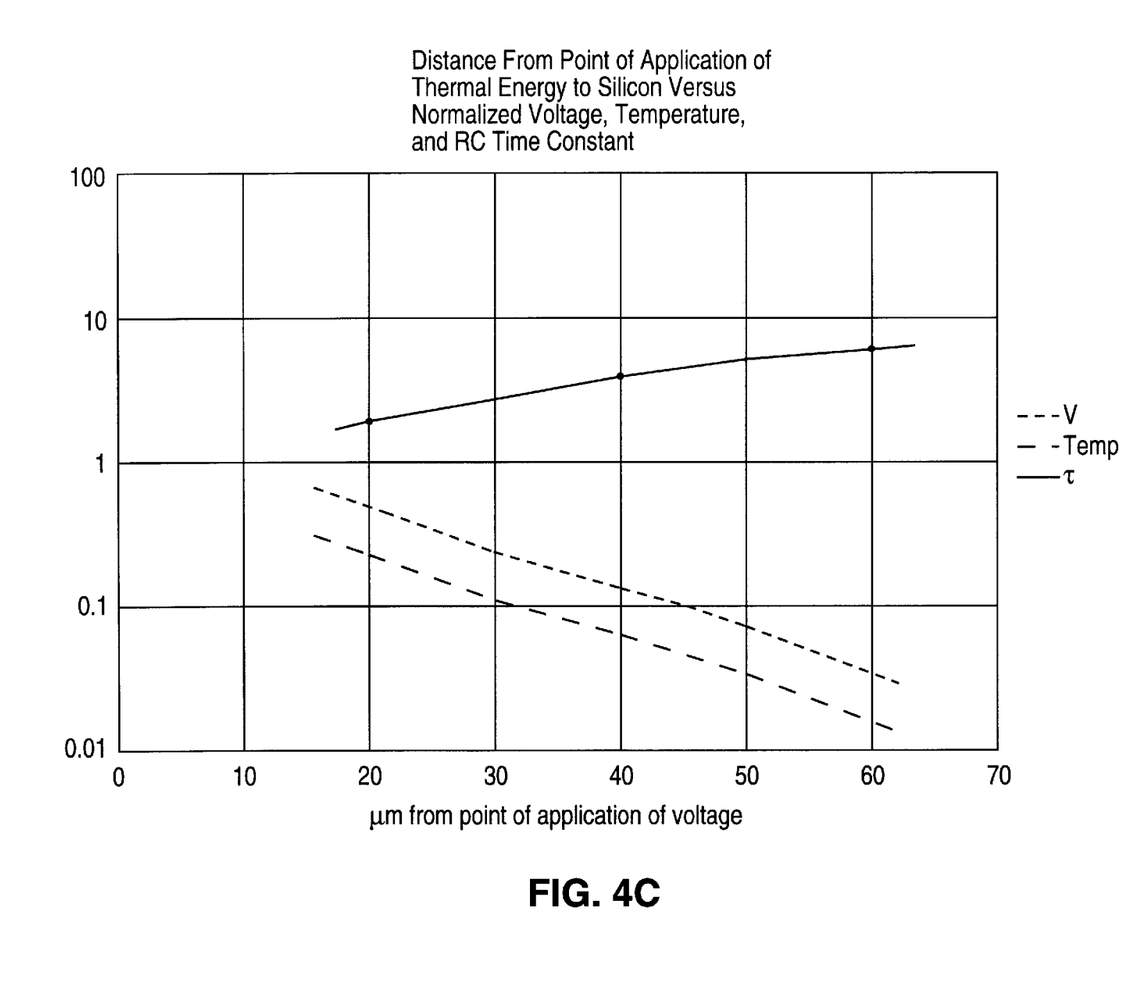
FIG. 4C plots simulated voltage, temperature, and time delay as a function of distance from the point of initial application of thermal energy, for the thermal RC network/transistor array shown in FIG. 4A.

FIG. 4C plots simulated and measured voltage, temperature, and time constant as a function of distance from the point of initial application of thermal energy, for the transistor array shown in FIG. 4A. As expected, the silicon temperature declines moving away from the point of application of the thermal energy. As a direct result, the $\Delta V_{be}$ experienced by the transistors also declines moving away from the point of application of the HEAT_APPLIED voltage. Also as expected, the overall time constant $\tau$ of the thermal RC network increases at greater distances from the point of application of the HEAT_APPLIED voltage.

Figure 4D:
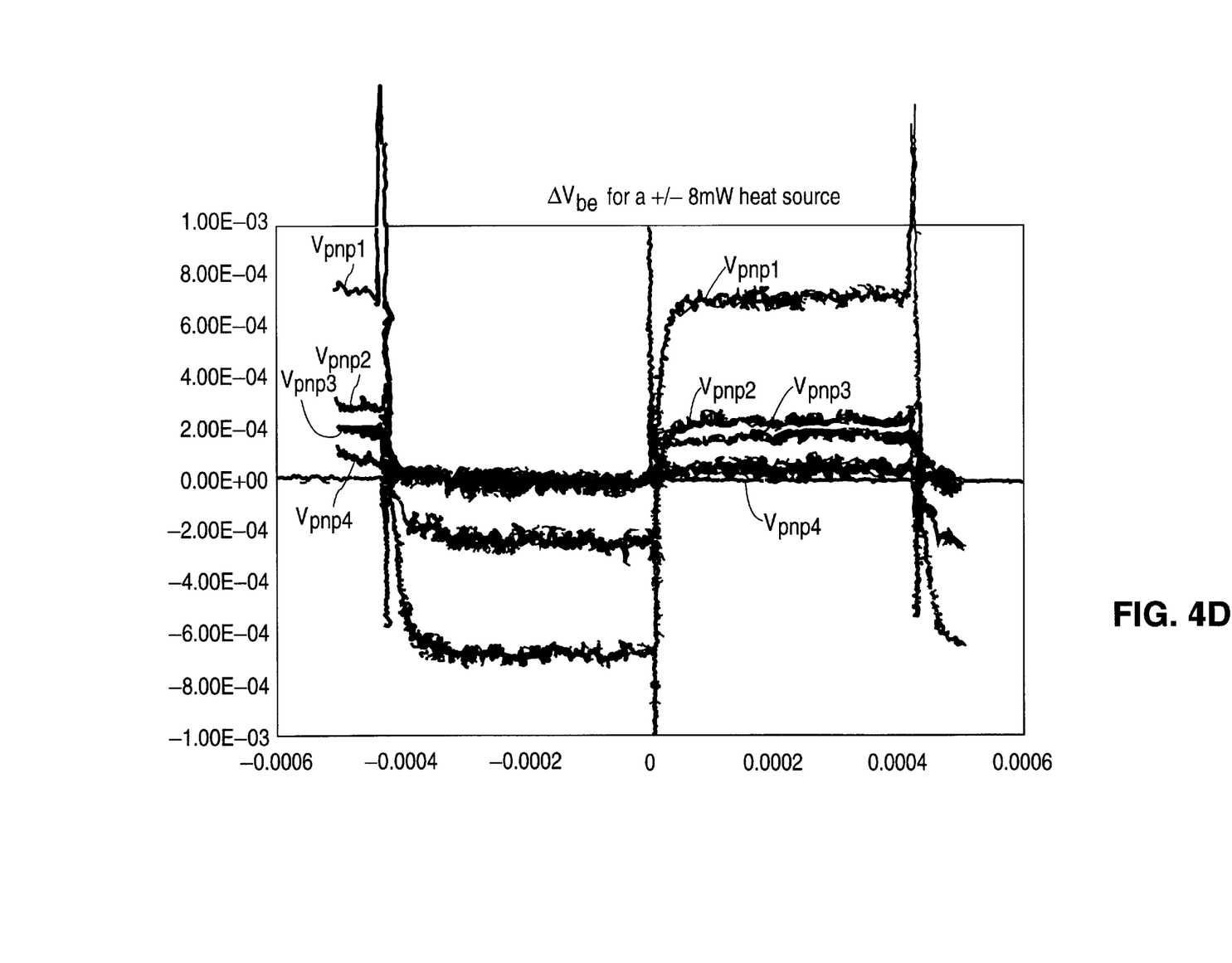
FIG. 4D plots an experimentally observed thermal shift in $V_{be}$ offset over time, for the first, second, third, and fourth transistors of an actual lateral array of six PNP transistors.

FIG. 4D plots an experimentally observed phase shift in $V_{be}$ for the second, third, fourth, and fifth transistors of an actual detection circuit utilizing a thermal RC network in the form of a six-PNP transistor lateral array. As expected, the $\Delta V_{be}$ experienced by the transistor in the array nearest to application of heat ($\Delta V_{pnp1}$) is larger than the change in voltage experienced at the second ($\Delta V_{pnp2}$), third ($\Delta V_{pnp3}$), and fourth ($\Delta V_{pnp4}$) transistors: $\Delta V_{pnp1} > \Delta V_{pnp2} > \Delta V_{pnp3} > \Delta V_{pnp4}$.

Figure 5:
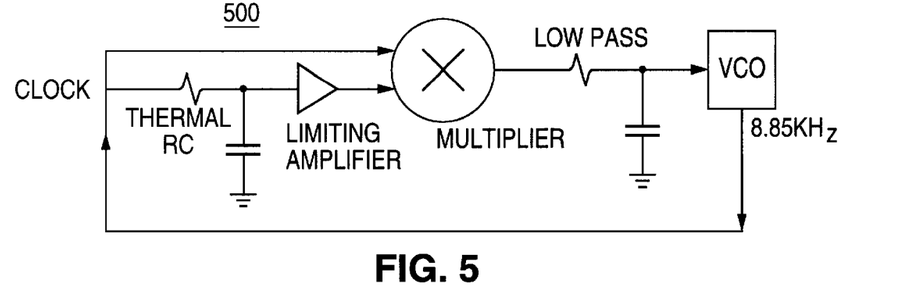
FIG. 5 shows a schematic diagram of a simple constant-frequency analog oscillator circuit in accordance with the present invention.

FIG. 5 shows a schematic diagram of a first embodiment of a simple oscillator circuit 500 in accordance with the present invention. Using the six PNP transistor lateral array thermal RC network shown in FIG. 4A, the free-running frequency of the detection circuit of FIG. 3A was 5.7 kHz. Once the circuit loop shown in FIG. 5 was completed, the frequency remained stable at 8.85 kHz.

The change in $\tau$ resulting from implementation of the same lateral array of PNP bipolar transistors in different silicon die was measured utilizing a frequency counter. For a simple implementation of the circuit, the frequency shift was about ±0.2%. This confirms that $\tau$ varies little over different blocks of silicon.

Given an increase in the ambient temperature of the circuit from room temperature to about 100° C., the frequency increased about 0.3% A decrease in ambient temperature from room temperature to about −40° C. produced about the same change in the value of $\tau$. Taken together, these measurements indicate that the temperature coefficient of the circuit is both consistent and relatively small.

Figure 6:
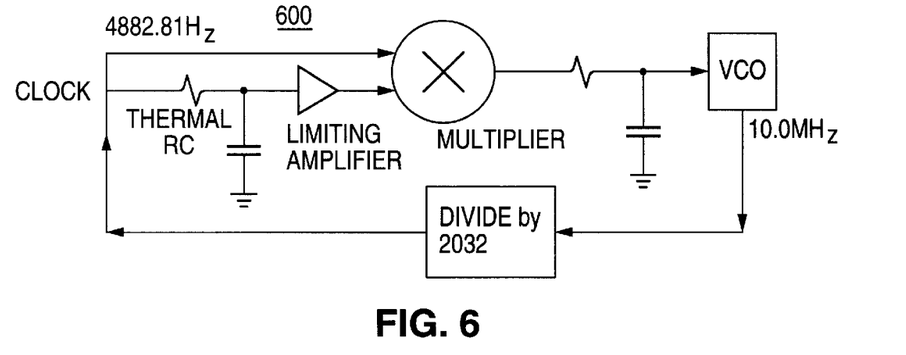
FIG. 6 shows a schematic diagram of an oscillator circuit having a constant frequency of 10 MHz, in accordance with the present invention.

A standard frequency for many microprocessors is 10 MHz. Therefore, FIG. 6 shows a schematic diagram of an oscillator circuit 600 in accordance with the present invention having a constant frequency of 10 MHz. As discussed above, the time constant $\tau$ of a given thermal RC network could be varied to achieve a phase shift of a specific magnitude simply by adjusting spacing between the laterally arrayed transistors. In the circuit shown in FIG. 6, flip flops were required to divide down the VCO clock signal to 10 MHz.

Figure 7A:
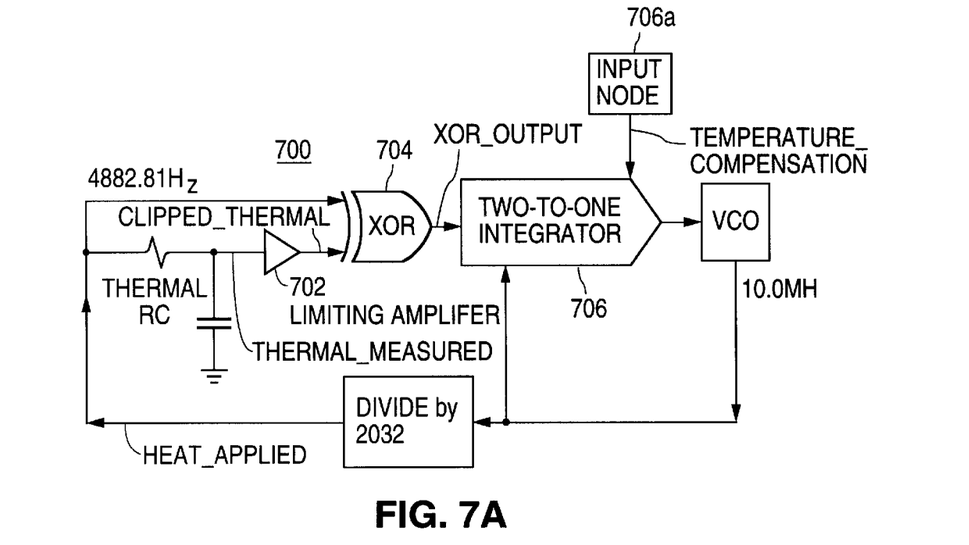
FIG. 7A shows a schematic diagram of a near-digital oscillator circuit having a constant frequency of 10 MHz in accordance with the present invention.

While the embodiments of the present invention shown in FIGS. 5 and 6 employ analog frequency detection and regulation, this function can also be performed utilizing digital circuit components. FIG. 7A shows a schematic diagram of a near-digital oscillator circuit 700 having a frequency of 10 MHz in accordance with the present invention.

In the near-digital embodiment shown in FIG. 7A, the step of limiting the THERMAL_MEASURED waveform is still performed by an analog limiting amplifier 702. However, this analog limiting function could be accomplished utilizing only CMOS structures, with standard digital CMOS inverters operating in their "linear" region.

In FIG. 7A, the analog multiplier has been replaced by an "exclusive or" (XOR) gate 704. XOR gate 704 receives the clock (HEAT_APPLIED) signal from the VCO and the CLIPPED_THERMAL signal from the analog limiting amplifier. In response, XOR gate 704 produces an XOR_OUTPUT comparison signal.

The two-to-one integrator 706 receives the XOR_OUTPUT signal. Integrator 706 also includes a second input node 706a for receiving a digital TEMPERATURE_COMPENSATION signal as an input. The purpose of the TEMPERATURE_COMPENSATION signal is to adjust the frequency of the output to compensate for changes in $\tau$ attributable to variation in ambient temperature.

As shown above in Equations (I) and (II) and FIG. 2, the thermal resistance and capacitance of silicon varies somewhat with temperature. Thus, changes in thermal resistance and capacitance due to variations in ambient temperature would affect the time constant $\tau$ exhibited by the RC network. This change in $\tau$ with temperature would in turn affect the frequency of the circuit. Therefore, input to the integrator could be used to compensate for the temperature dependence of thermal resistance and thermal capacitance.

Figure 7B:
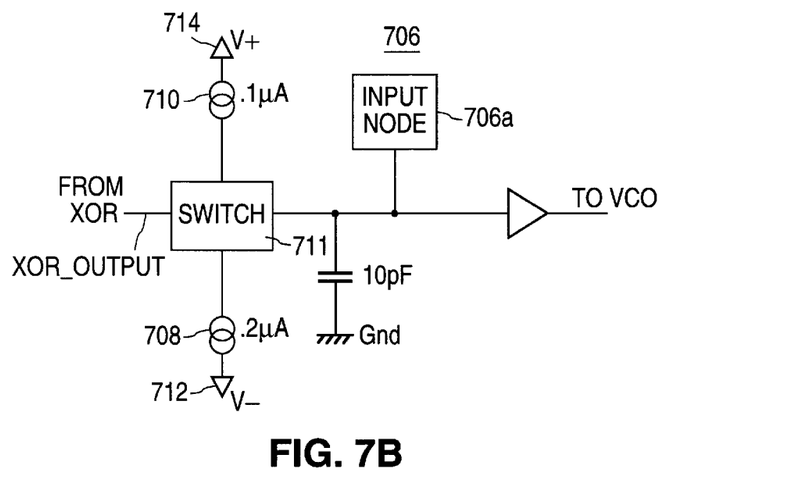
FIG. 7B shows a circuit schematic of the two-to-one integrator of the oscillator circuit shown in FIG. 7A.
Figure 7C:
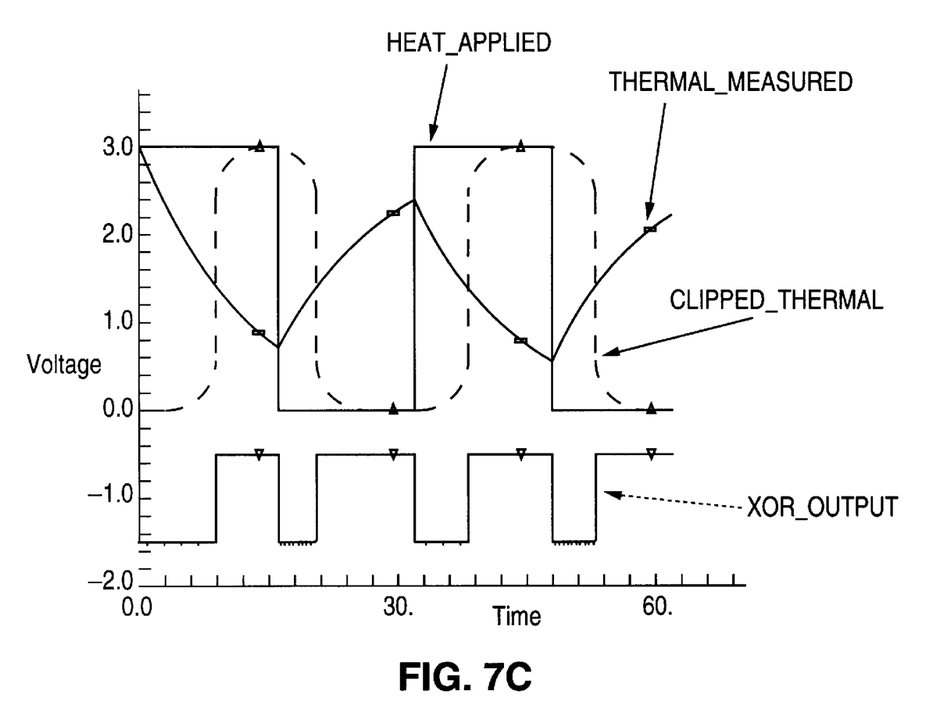
FIG. 7C plots waveforms for the HEAT_APPLIED voltage (the clock signal), the THERMAL_MEASURED voltage, the CLIPPED_THERMAL voltage, and the XOR_OUTPUT voltage of the oscillator circuit shown in FIG. 7A.

FIG. 7B shows a circuit schematic of a two-to-one integrator 706 that may be used in the present invention. Two-to-one integrator 706 includes constant current sources 708 and 710. Constant current source 708 is connected to low voltage rail 712. Constant current source 710 is connected to high voltage rail 714.

Input from current sources 708 and 710 is controlled by switch 711. Switch 711 receives input from current sources 708 and 710, as well as the XOR_OUTPUT voltage from the XOR gate. Switch 711 selects between current sources 708 and 710 to provide an output based the XOR_OUTPUT voltage.

The resulting output from switch 711 is then supplemented by the TEMPERATURE_COMPENSATION input from node 706a. The combined signal is then amplified and communicated to the VCO.

The present invention offers several important advantages over existing frequency detection and correction configurations. For example, until now it was not possible to completely integrate a frequency detection and monitoring system on a single die. Often, an external crystal or resonator component was required, at considerable added expense.

However, with the present invention all of the functional blocks of the circuit are standard components of integrated circuits. Amplifiers, bipolar transistors, XOR logic gates, integrators, and other elements of the circuit can readily be manufactured and incorporated into the integrated circuit.

The present invention also avoids the problem posed by conventional electronic RC networks that are unable to exhibit sufficiently consistent electrical resistances and capacitances to provide a dependable frequency reference. In the present invention, the crucial thermal properties of silicon should remain substantially constant over a variety of manufacturing conditions. This is because highly-ordered single crystal silicon created during standard fabrication processes should also exhibit highly consistent thermal resistance and capacitance.

The present invention is designed to minimize introduction of unwanted variation into the output of the circuit due to changes in ambient temperature. By sampling the waveform generated by the heat pulse from two points in the thermal RC network, any global increase in temperature will not be reflected in a change in the time constant and a corresponding change in phase shift.

Moreover, the circuit provides for an input to compensate for changes in thermal resistance and thermal capacitance of single-crystal silicon attributable to changes in ambient temperature.

While the frequency detection and correction function provided by the present invention does result in a somewhat larger circuit, the overall size of this circuit is still quite small. The frequency detection and correction function provided by the present invention should easily fit into the smallest three lead package available. Moreover, the total expense of the device should be dominated by package costs, because a constant 10 MHz frequency output should be cheap to test.

Although the invention has been described in connection with several specific embodiments, it should not be unduly limited to such embodiments. Various other modifications and alterations in the structure and method of operation of this invention will be apparent to those skilled in the art without departing from the scope of the present invention.

For example, FIGS. 3 and 4A illustrate the use of arrayed PNP bipolar transistors to detect propagation of the heat pulse through the single crystal silicon. Changes in the $V_{be}$ of these transistors indicates the passage of the heat pulse. However, the present invention is not limited this specific form of heat detection. Changes in the $V_{be}$ of NPN bipolar transistors, or even changes in the voltage of any forward-biased PN junction, could also be used to detect a change in temperature caused by a heat pulse.

Figure 8:
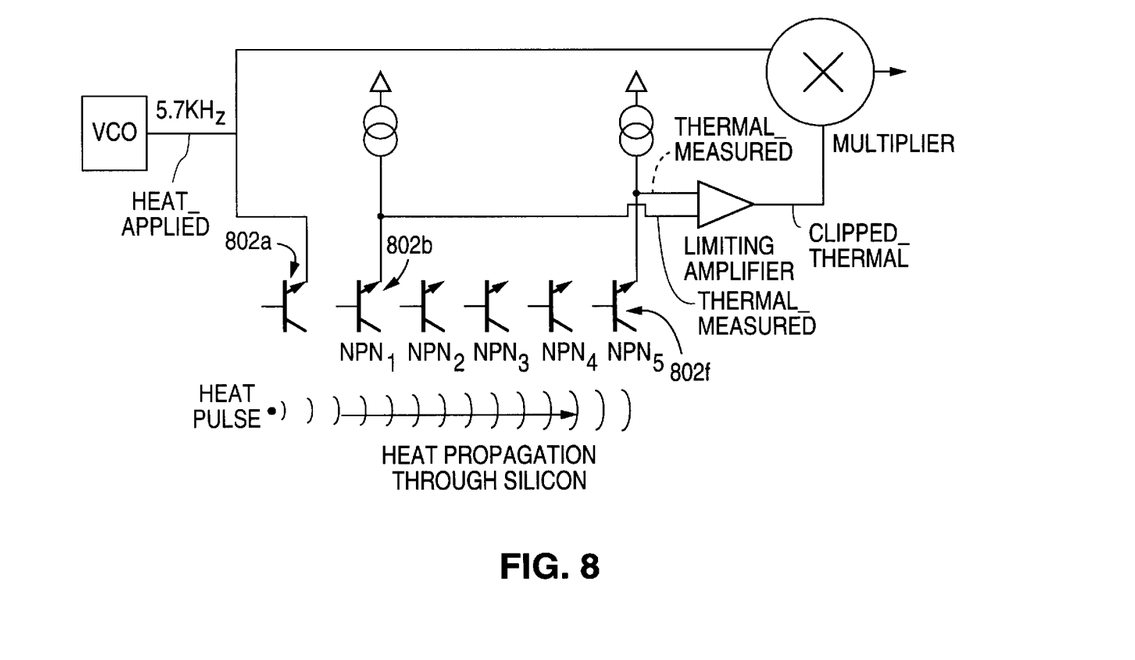
FIG. 8 shows a schematic of a detection circuit in accordance with an alternative embodiment of the present invention utilizing six laterally arrayed NPN transistors connected to an FM detector.

Accordingly, FIG. 8 shows a schematic of a detection circuit in accordance with an alternative embodiment of the present invention. In the alternative embodiment shown in FIG. 8, current is applied to first NPN bipolar transistor 802a to generate a heat pulse in the single crystal silicon. Changes in Vbe of NPN bipolar transistors 802b and 802f arrayed in the single crystal silicon are then utilized to generate a differential voltage reflecting delay in propagation of this heat pulse.

Moreover, FIGS. 7A–7B describe input of a TEMPERATURE_COMPENSATION voltage to input node 706a of integrator 706, in order to compensate for variations in ambient temperature. However, another potential application would be to utilize this node to create a "spread spectrum" effect.

The "spread spectrum" effect involves intentional random FM modulation of the clock signal of central processing unit. This random modulation is performed so that if the clock signal happens to fall within the frequency range of an unrelated RF input, the random modulation creates a "spread spectrum" which is interpreted by the RF input as noise, and ignored. Random modulation of the clock signal giving rise to the "spread spectrum" can be accomplished by applying a random input to the system via the input node of the integrator.

In addition to compensating for changes in ambient temperature and inducing random modulation, the input node of the integrator may also be utilized as part of a phase lock loop (PLL) feature. Specifically, the clock signal in accordance with the present invention may be synchronized with an external reference signal utilizing a PLL configuration. In such an application, the external reference signal could be incorporated into the oscillation circuit through the input node of the integrator.

The present invention has so far been discussed exclusively in relation to a circuit for maintaining a constant frequency output of the oscillator. However, the underlying physical principles could also be utilized to create a temperature sensor.

To understand this, recall again that the relation between ambient temperature and thermal resistance and thermal capacitance of silicon is set forth in Equation (I) and FIG. 2, respectively. Recall also that the output frequency of circuit 700 is independent of the frequency, amplitude, and duty cycle of the original VCO signal.

Thus in FIG. 7A, where no additional voltage is input at second node 706a of integrator 706, the frequency of output of the circuit 700 could be monitored for changes. Any variation in output would be attributable only to a change in the time delay τ of the thermal RC network, and thus to variation in thermal resistance and capacitance of silicon due to changes in ambient temperature. In this manner, the present invention could also be utilized as a temperature detector such that changes in output frequency of the circuit could be monitored and calibrated to indicate changes in ambient temperature.

Therefore, a method for measuring temperature in accordance with the present invention comprises the steps of providing a semiconductor workpiece having a thermal resistance and a thermal capacitance, applying a clock signal from a voltage controlled oscillator to a heat source positioned at a first point within the semiconductor workpiece, the heat source generating a heat pulse in response to the clock signal, providing a thermal RC network within the silicon having a thermal time constant, the thermal RC network receiving the heat pulse and producing a voltage signal based upon the thermal time constant, amplifying and limiting the voltage signal to produce a clipped output voltage, comparing the clock signal and the clipped output voltage to produce a feedback voltage corresponding to a phase difference between the clock signal and the clipped output voltage, and correlating the feedback voltage to variation in the thermal resistance and the thermal capacitance of the semiconductor workpiece caused by a change in ambient temperature.

In light of the above description, it is intended that the following claims define the scope of the present invention, and that the methods and structures within the scope of these claims and their equivalents be covered hereby.

What is claimed is:

1. An apparatus for producing an output signal with a substantially constant frequency, comprising:

a semiconductor workpiece exhibiting a thermal resistance and a thermal capacitance;

a voltage controlled oscillator formed in the semiconductor workpiece, the voltage controlled oscillator producing a clock signal having a first frequency;

a heat source positioned at a first point within the semiconductor workpiece, the heat source receiving the clock signal and in response generating a heat pulse in the semiconductor workpiece;

a thermal RC network formed within the semiconductor workpiece and having a thermal time constant, the thermal RC network receiving the heat pulse and producing a voltage signal based upon the thermal time constant;

a limiting amplifier receiving the voltage signal and in response amplifying and limiting the voltage signal to produce a clipped output voltage; and a comparator receiving the clock signal and the clipped output voltage, the comparator producing a feedback voltage to the voltage controlled oscillator corresponding to a phase difference between the clock signal and the clipped output voltage, wherein the voltage controlled oscillator alters the first frequency of the clock signal in response to the feedback voltage.

2. The apparatus according to claim 1 wherein:

the thermal RC network comprises a lateral array of forward-biased PN junctions formed within the semiconductor workpiece, the lateral array including a first forward-biased PN junction proximate to the first point and a second forward-biased PN junction distal from the first point, the first forward-biased PN junction in electrical communication with a first fixed current source and the second forward-biased PN junction in electrical communication with a second fixed current source; and the limiting amplifier receives a first voltage signal from the first forward-biased PN junction and a second voltage signal from the second forward-biased PN junction and produces the clipped output voltage reflecting a difference between the first and second voltage signals.

3. The apparatus according to claim 2 wherein the first forward-biased PN junction is a base-emitter junction of a first PNP bipolar transistor and the second forward-biased PN junction is a base-emitter junction of a second PNP bipolar transistor.

4. The apparatus according to claim 2 wherein the first forward-biased PN junction is a base-emitter junction of a first NPN bipolar transistor and the second forward-biased PN junction is a base-emitter junction of a second NPN bipolar transistor.

5. The apparatus according to claim 1 further comprising a divider structure receiving the clock signal from the voltage controlled oscillator and producing a divided clock signal to the heat source.

6. The apparatus according to claim 1 wherein the comparator comprises:

an XOR gate receiving the clock signal and the clipped output voltage and producing a comparison signal; and an integrator receiving the comparison signal at a first input node and an input voltage at a second input node, the integrator generating the feedback voltage from the combination of the comparison signal and the input voltage.

7. The apparatus according to claim 6 wherein the input voltage comprises a temperature compensation voltage correcting the feedback voltage for variation in the thermal resistance and the thermal capacitance of the semiconductor workpiece attributable to a change in ambient temperature.

8. The apparatus according to claim 6 wherein the input voltage comprises a randomly modulated voltage signal causing the feedback voltage to exhibit a spread spectrum.

9. The apparatus according to claim 6 wherein the input voltage comprises an external reference signal having a frequency, the external reference signal causing the feedback voltage to synchronize with the frequency of the external reference signal.

10. A method for maintaining constant frequency output of a voltage controlled oscillator comprising the steps of:

providing a semiconductor workpiece having a thermal resistance and a thermal capacitance;

applying a clock signal from the voltage controlled oscillator to a heat source positioned at a first point within the semiconductor workpiece, the heat source generating a heat pulse in response to the clock signal;

providing a thermal RC network within the semiconductor workpiece having a thermal time constant, the thermal RC network receiving the heat pulse and producing a voltage signal based upon the thermal time constant;

amplifying and limiting the voltage signal to produce a clipped output voltage;

comparing the clock signal and the clipped output voltage to produce a feedback voltage corresponding to a phase difference between the clock signal and the clipped output voltage; and providing the feedback voltage to the voltage controlled oscillator, such that the frequency of the clock signal is altered in response to the feedback voltage.

11. The method according to claim 10 wherein the step of providing the thermal RC network comprises:

providing a lateral array of forward-biased PN junctions within the semiconductor workpiece, the lateral array including a first forward-biased PN junction proximate to the first point and a second forward-biased PN junction distal from the first point, the first forward-biased PN junction in electrical communication with a first fixed current source and the second forward-biased PN junction in electrical communication with a second fixed current source, such that the limiting amplifier receives a first voltage from the first forward-biased PN junction and a receives a second voltage from the second forward-biased PN junction and produces the clipped output voltage reflecting the difference between the first voltage and the second voltage.

12. The method according to claim 11 wherein the step of providing the first forward-biased PN junction includes providing a base-emitter junction of a first PNP bipolar transistor, and the step of providing a second forward-biased PN junction includes providing a base-emitter junction of a second PNP bipolar transistor.

13. The method according to claim 11 wherein the step of providing the first forward-biased PN junction includes providing a base-emitter junction of a first NPN bipolar transistor, and the step of providing a second forward-biased PN junction includes providing a base-emitter junction of a second NPN bipolar transistor.

14. The method according to claim 10 further comprising the steps of:

dividing the clock signal produced by the voltage controlled oscillator; and providing the divided clock signal to the heat source.

15. The method according to claim 10 wherein the step of comparing the clipped output voltage and the clock signal is performed by an analog multiplier.

16. The method according to claim 10 wherein the step of comparing the clipped output voltage to the clock signal is performed by a digital XOR gate that generates a comparison voltage.

17. The method according to claim 16 further comprising the steps of:

providing an integrator that receives the comparison voltage and an input voltage, the integrator adding the comparison voltage to the input voltage to produce the feedback voltage; and providing the input voltage to the integrator.

18. The method according to claim 17 wherein the step of providing the input voltage comprises providing a temperature compensation voltage to correct the feedback voltage for variation in the thermal resistance and the thermal capacitance of the semiconductor workpiece attributable to a change in ambient temperature.

19. The method according to claim 18 wherein the step of providing the input voltage comprises providing a randomly modulated voltage signal causing the feedback voltage to exhibit a spread spectrum.

20. The method according to claim 19 wherein the step of providing the input voltage comprises providing an external reference signal having a frequency, the external reference signal causing the feedback voltage to synchronize with the frequency of the external reference signal.

21. A method for measuring temperature comprising the steps of:

providing a semiconductor workpiece having a thermal resistance and a thermal capacitance;

applying a clock signal from a voltage controlled oscillator to a heat source positioned at a first point within the semiconductor workpiece, the heat source generating a heat pulse in response to the clock signal;

providing a thermal RC network within the semiconductor workpiece having a thermal time constant, the thermal RC network receiving the heat pulse and producing a voltage signal based upon the thermal time constant;

amplifying and limiting the voltage signal to produce a clipped output voltage;

comparing the clock signal and the clipped output voltage to produce a feedback voltage corresponding to a phase difference between the clock signal and the clipped output voltage; and correlating the feedback voltage to variation in the thermal resistance and the thermal capacitance of the semiconductor workpiece caused by a change in ambient temperature.

22. The method according to claim 21 wherein the step of providing the thermal RC network comprises:

providing a lateral array of forward-biased PN junctions within the semiconductor workpiece, the lateral array including a first forward-biased PN junction proximate to the first point and a second forward-biased PN junction distal from the first point, the first forward-biased PN junction in electrical communication with a first fixed current source and the second forward-biased PN junction in electrical communication with a second fixed current source, such that the limiting amplifier receives a first voltage from the first forward-biased PN junction and receives a second voltage from the second forward-biased PN junction, and produces the clipped output voltage reflecting the difference between the first voltage and the second voltage.

23. The method according to claim 22 wherein the step of providing the first forward-biased PN junction includes providing a base-emitter junction of a first PNP bipolar transistor, and the step of providing a second forward-biased PN junction includes providing a base-emitter junction of a second PNP bipolar transistor.

24. The method according to claim 22 wherein the step of providing the first forward-biased PN junction includes providing a base-emitter junction of a first NPN bipolar transistor, and the step of providing a second forward-biased PN junction includes providing a base-emitter junction of a second NPN bipolar transistor.

* * * * *